US006984556B2

(12) United States Patent
Drabe et al.

(10) Patent No.: US 6,984,556 B2
(45) Date of Patent: Jan. 10, 2006

(54) METHOD OF FORMING AN ISOLATION LAYER AND METHOD OF MANUFACTURING A TRENCH CAPACITOR

(75) Inventors: Christian Drabe, Dresden (DE); Jana Haensel, Dresden (DE); Anke Krasemann, Dresden (DE); Barbara Lorenz, Dresden (DE); Thomas Morgenstern, Dresden (DE); Torsten Schneider, Ottendorf-Okrilla (DE); Bruno Spuler, München (DE)

(73) Assignee: Infineon Technologies AG, (DE)

( * ) Notice: Subject to any disclaimer, the term of this patent is extended or adjusted under 35 U.S.C. 154(b) by 0 days.

(21) Appl. No.: 10/483,423

(22) PCT Filed: Jun. 24, 2002

(86) PCT No.: PCT/EP02/06977

§ 371 (c)(1),
(2), (4) Date: May 14, 2004

(87) PCT Pub. No.: WO03/010810

PCT Pub. Date: Feb. 6, 2003

(65) Prior Publication Data

US 2004/0198015 A1  Oct. 7, 2004

(30) Foreign Application Priority Data

Jul. 23, 2001 (EP) .................................. 01117854

(51) Int. Cl.
*H01L 21/8242* (2006.01)

(52) U.S. Cl. ..................................... 438/248; 438/391
(58) Field of Classification Search ................ 438/243, 438/244, 248, 386, 387, 391
See application file for complete search history.

(56) References Cited

U.S. PATENT DOCUMENTS

| 5,930,585 | A | 7/1999 | Coronel et al. |
| 6,066,566 | A | 5/2000 | Naeem et al. |
| 6,074,954 | A | 6/2000 | Lill et al. |
| 6,171,974 | B1 | 1/2001 | Marks et al. |
| 6,685,803 | B2 * | 2/2004 | Lazarovich et al. ........ 204/164 |
| 6,800,210 | B2 * | 10/2004 | Patel et al. ................. 438/706 |

FOREIGN PATENT DOCUMENTS

JP           62142326 A      6/1987

* cited by examiner

*Primary Examiner*—Chandra Chaudhari
(74) *Attorney, Agent, or Firm*—Edell, Shapiro & Finnan, LLC

(57) ABSTRACT

A two-step etch process is used to form a vertical collar oxide within the upper portion of a trench capacitor. The first step uses $CF_4/SiF_4/O_2$ chemistry and ends when the bottom of the collar within the trench is opened although a thin oxide layer still remains on the surface of the PAD-nitride. The second etch step uses $C_4F_8$ chemistry to completely remove the remaining silicon oxide layer. The process provides a good uniformity in thickness of the PAD-nitride layer and sufficient collar oxide thickness in the very top section of the collar oxide. The process is applicable for manufacturing deep trench capacitors for DRAM devices.

15 Claims, 3 Drawing Sheets

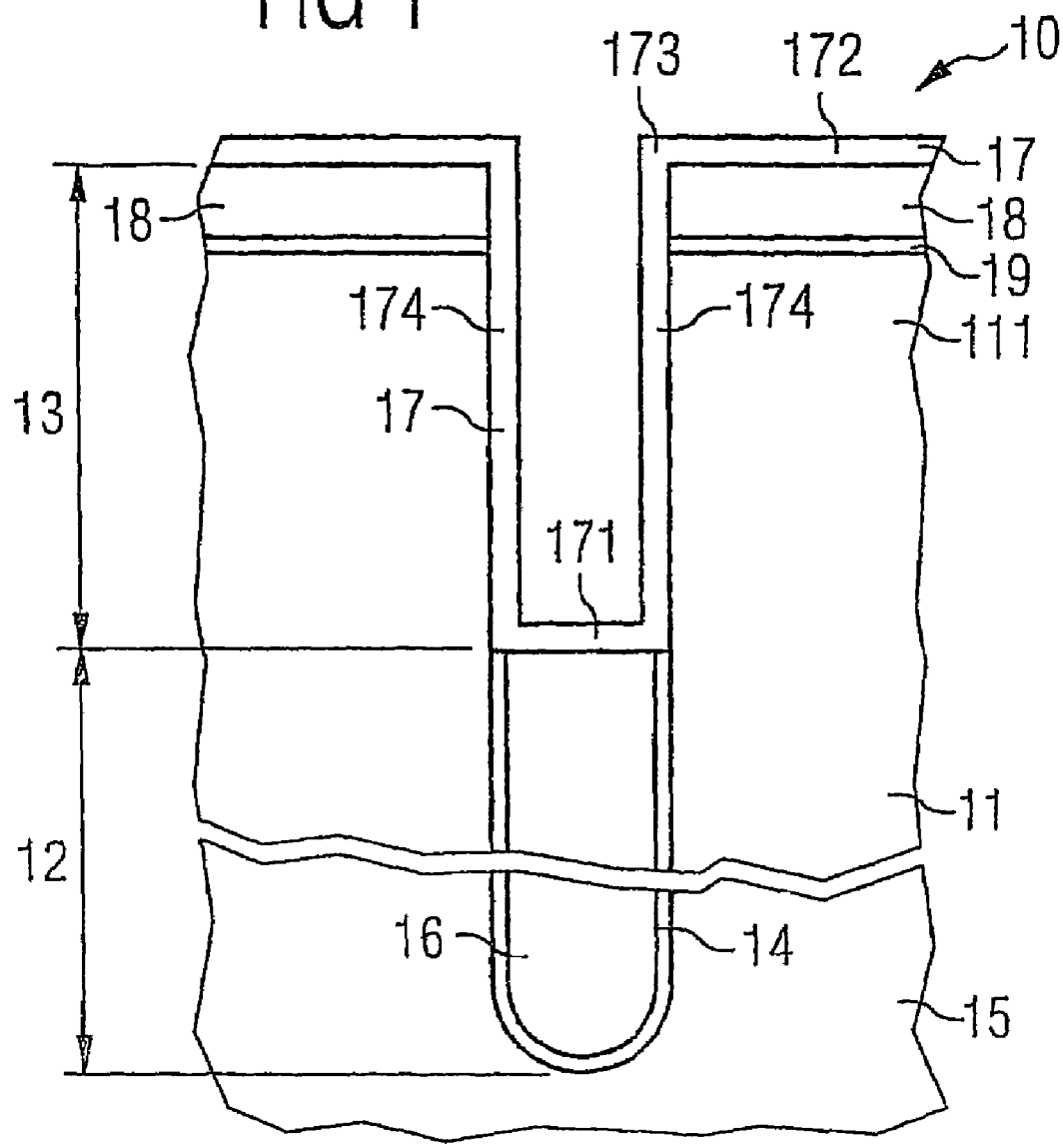

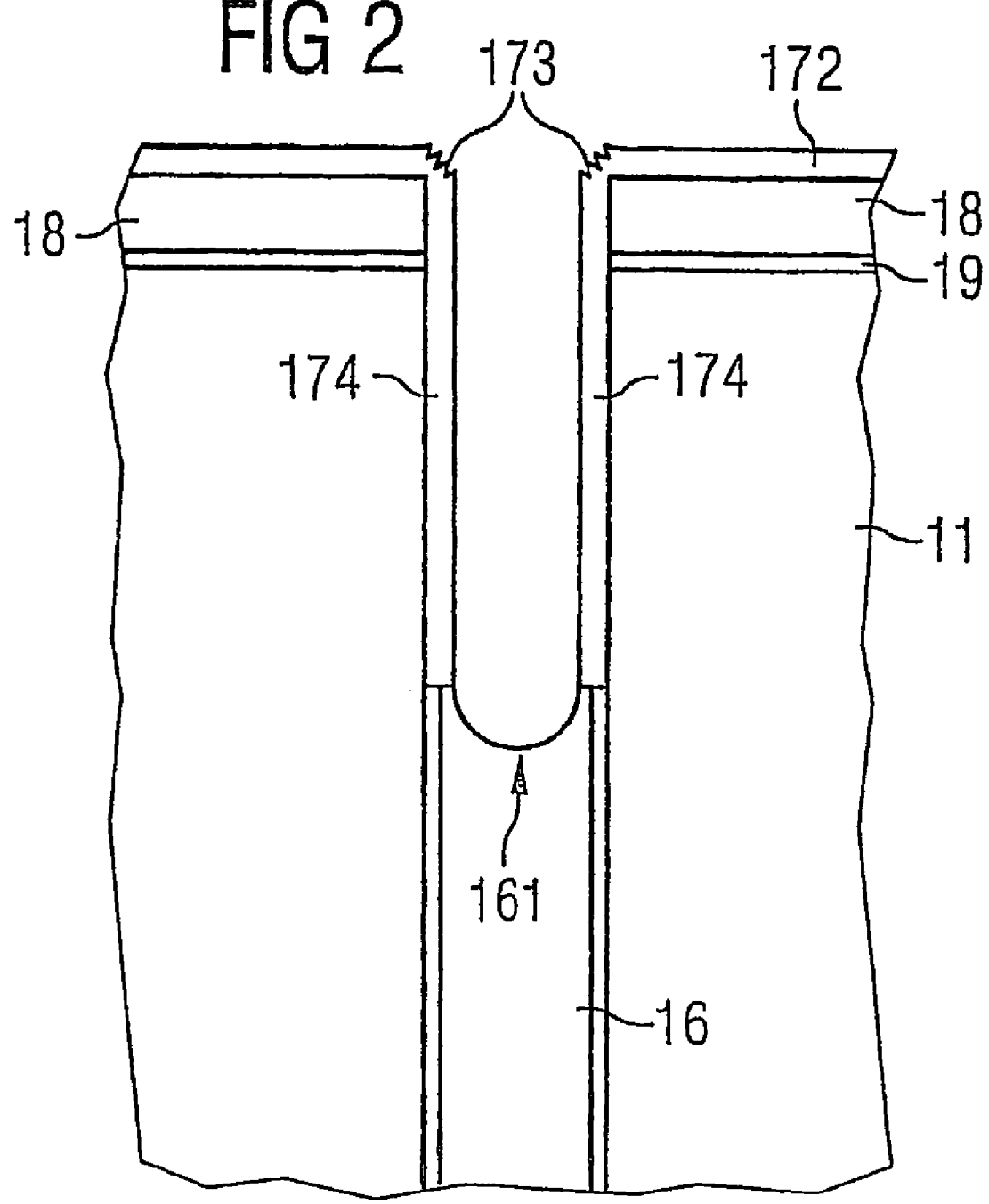

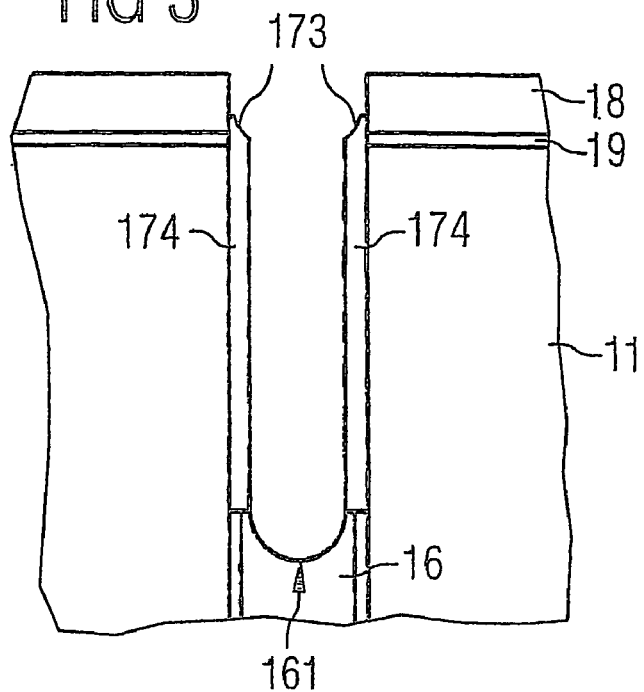
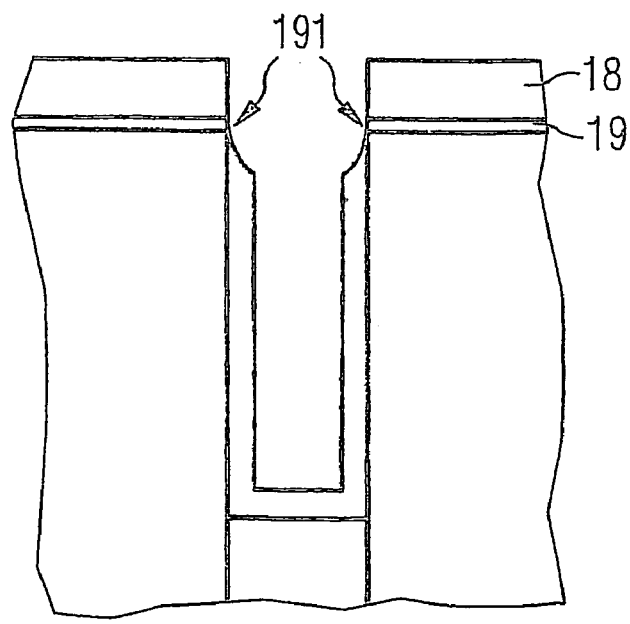

METHOD OF FORMING AN ISOLATION LAYER AND METHOD OF MANUFACTURING A TRENCH CAPACITOR

CROSS-REFERENCE TO RELATED APPLICATIONS

This application claims priority under 35 USC § 119(e) to European Application No. EP01117854.8, filed on Jul. 23, 2001, and titled "Method Of Forming An Isolation Layer and Method of Manufacturing a Trench Capacitor," the entire contents of which are hereby incorporated by reference.

FIELD OF THE INVENTION

The invention relates to a method of forming an isolation layer on the sidewalls of a trench whereby a semiconductor wafer that comprises a substrate is provided. The substrate has a first isolation layer arranged on a main surface of the substrate and having a trench arranged within the substrate. A second isolation layer is being deposited on the wafers, The horizontal portions of the second isolation layer are to be etched. The invention further relates to a method of manufacturing a trench capacitor that uses the above method of forming an isolation layer on the sidewalls of the trench.

BACKGROUND

In the field of manufacturing dynamic random access memories (DRAMs), the storage capacitor is formed as a deep trench capacitor within the semiconductor substrate. The lower portion of the trench comprises the storage node having one plate of the capacitor within the substrate, having the dielectric layer arranged on the sidewalls of the lower portion of the trench and having the second electrode arranged preferably as a polysilicon filling material within the trench. The upper portion of the trench is isolated from the substrate by a so called collar isolation, preferably a thick silicon oxide collar layer. In the sequence of process steps for the manufacturing of the trench capacitor, the semiconductor wafer is provided with the storage node already completed. At this point, the lower portion of the trench has the dielectric layer arranged on its sidewalls and is filled with polysilicon. On the surface of the wafer, a PAD-silicon nitride layer is already deposited. The upper portion of the deep trench is still open and subject to further processing. Now, a conformal isolation layer, preferably a silicon oxide layer, is deposited on the wafer. As a result, the conformal layer of silicon oxide is present on the sidewalls of the upper portion of the trench, on the bottom surface of said upper portion of the trench, and on the silicon nitride layer on the main surface of the semiconductor wafer. Within the upper portion of the trench, the silicon oxide layer is directly deposited onto the upper end of the polysilicon filling material, which is arranged in the lower portion of the deep trench. At this stage, the process of manufacturing the trench capacitor continues with the removal of the horizontal portions of the conformal silicon oxide layer, e.g the portions being arranged on the bottom of the upper portion of the deep trench. As a result, the vertical portions of the silicon oxide layer remain on the sidewalls of the upper portion of the deep trench as a collar isolation in order to electrically isolate the further filling of the upper portion of the deep trench from the surrounding substrate of the semiconductor wafer. The bottom of the upper portion consisting of, e.g., silicon oxide is opened to ensure the electrical accessibility of the polysilicon in the lower portion of the trench. At a later phase of the manufacturing process of a DPAM device, an active area comprising an access transistor is formed within the substrate adjacent to the collar isolation.

The opening of the bottom surface of the trench must be performed without damaging the silicon nitride layer. For such removal of silicon oxide, a dry etch process using the etch gas $C_4F_8$ is already known. The etching with $C_4F_8$ provides sufficient selectivity between silicon oxide and silicon nitride on the surface of the wafer and moreover provides a good etch stop performance on the bottom of the trench versus the polysilicon filling material. A disadvantage of the etch gas $C_4F_8$, however, is that the very top section of the vertical part of the collar oxide is also etched to a larger extend due to the high silicon oxide etch rate of $C_4F_8$. This is particular true when used in capacitively working plasma etch chambers, where a high sheath voltage causes a high ion energy acceleration to the wafer surface which results in a high oxide etch rate. As a consequence said very top vertical section of the collar oxide may be recessed to such an extend that the silicon oxid (PAD-oxide) hidden behind the collar oxide underneath the PAD-nitride subsequent process steps. One of the subsequent process steps is an isotropic silicon wet etch which can undercut the PAD-silicon nitride layer. The reliability of the process is less stable and the production yield for DRAM devices is lower.

It is an object of the invention to provide a more stable and more reliable process of forming an isolation layer on the sidewalls of a trench. It is a further object of the invention to provide a more stable and more reliable method of manufacturing a trench capacitor having such an isolation layer.

According to the invention, a method of forming an isolation layer on the sidewalls of a trench can include providing a semiconductor wafer comprising a substrate having a first isolation layer stack arranged on a main surface of the substrate and having a trench arranged in the substrate; depositing a second isolation layer on the wafer; etching the wafer in a first step with a first etch gas composition comprising the gases $CF_4$ and $SiF_4$ and $O_2$; and etching the wafer in a second etch step subsequent to the first etch step with a second etch gas composition comprising the gas $C_4F_8$.

A method of manufacturing a trench capacitor, as described above can include a semiconductor wafer including a deep trench having a lower portion with a dielectric layer arranged on its sidewalls and being filled with silicon and having an upper portion being arranged above the lower portion with the second isolation layer being deposited on the sidewalls of the upper portion of deep trench, and on the surface of the silicon arranged within the lower portion of the deep trench, and on the surface of the first isolation layer stack.

The methods according to the invention benefit from a twostep etch process for the removal of the horizontal portions of the second isolation layer so that only the vertical portions remain, thereby forming a reliable collar oxide within the trench capacitor. The two steps of the etch process have different properties that are adopted to the progressing of the overall etch procedure. In this respect, the first etch step comprises a gas composition of $CF_4$, $SiF_4$, and $O_2$. This etch gas composition is known to etch silicon oxide, silicon nitride, and polysilicon at substantially the same rate, e.g., without substantial selectivity to each other. The etch rate of silicon oxide on the top of the wafer can be adjusted to be rather low. There is only little removal of silicon oxide on the top surface of the wafer so that it can be assured that there is always a sufficiently thick silicon oxide layer on the silicon nitride layer that protects the silicon nitride. At the bottom of the trench, the etch rate of silicon oxide is rather reasonable so that the silicon oxide is frilly removed from the underlying polysilicon filling material. As a result of the first etch step using $CF_4$, $SiF_4$, and $O_2$, the silicon oxide on the bottom of the trench is removed whereas a thin silicon oxide layer is still present on the top main surface of the wafer protecting the silicon nitride. Moreover, the very top section of the vertical collar oxide is not damaged. The different etch rates for silicon oxide on the bottom of the trench and on the top surface are due to the fact that there is etching and deposition of silicon oxide on the top surface and the trench bottom at the same time. At the trench bottom, the removal of silicon oxide dominates strongly over the deposition of silicon oxide, whereas at the top surface the removal dominates only slightly over the deposition resulting in a higher overall oxide etch rate at the trench bottom than at the top surface.

In the second etch step, the etch chemistry $C_4F_8$ which is preferably diluted with CO or alternatively CO and $O_2$. This chemistry is known for substantially high selectivity between silicon oxide and silicon nitride so that the thin layer of silicon oxide that was left at the end of the first etch step can be etched away in a rather uniform way without damaging the underlying silicon nitride layer. It is to be noted that the vertical portion of the silicon oxide layer at the very top of the collar is recessed during the second etch step, due to the aggressiveness of the etch gas with respect to silicon oxide. The amount of recess, however, can be tolerated and is clearly within the thickness of the silicon nitride layer and does definitely not reach below the silicon nitride layer. The silicon substrate that is to be protected by the collar oxide is, therefore, sufficiently covered at the very top portion of the trench where the silicon substrate contacts the silicon nitride layer so that there is no undercut by subsequent application of wet etch chemicals.

As an overall consequence, the collar etch combines the advantages of $C_4F_8$ and $CF_4/SiF_4/O_2$ etch properties for the etching of the collar oxide for the manufacturing of a trench capacitor. As a result, a defined nitride surface is provided on the top of the wafer having good uniformity of the nitride layer, the collar oxide is only recessed little at the trench top and the collar oxide at the trench bottom is opened perfectly.

The first etch step using $CF_4/SiF_4O_2$ chemistry is finished when the silicon oxide is completely removed from the bottom of the trench. The second etch step using $C_4F_8$ chemistry is finished when the silicon oxide on top of the wafer, i.e., on top of the silicon nitride, is completely removed. The first etch step is run by time or endpoint while the second etch step is finished by endpoint. The second etch step employs a polymerizing chemistry. It is therefore advantageous to introduce a subsequent sputter etch with $O_2$ to remove probable polymer residues which is preferably followed by a wet etch clean.

As already stated, the isolation layer on the vertical sidewalls of the trench are particularly useful for a collar isolation oxide layer which isolates the upper part of a trench capacitor. The upper portion of the overall deep trench capacitor which is subject to the aforementioned etch processes serves to isolate the subsequent polysilicon filling of the trench from the surrounding silicon substrate where the active areas including access transistors are subsequently formed. The lower portion of the trench capacitor serves as the storage node comprising the two electrodes of the capacitor.

BRIEF DESCRIPTION OF THE FIGURES

The invention will now be described in detail with reference to the various figures within the drawings.

FIG. 1 shows a cross-section of a deep trench capacitor after the deposition of a silicon oxide layer.

FIG. 2 shows a cross-section of the upper part of the deep trench capacitor after the first etch step using $CF_4/SiF_4/O_2$ and etch chemistry.

FIG. 3 shows the same cross-section at the end of the process after the second etch step using $C_4F_8$ etch chemistry.

FIG. 4 shows a comparable cross-section after a conventional etch using $C_4F_8$ etch chemistry only.

DETAILED DESCRIPTION

The cross-section depicted in FIG. 1 shows a semiconductor wafer 10 having a silicon substrate 11. Within the substrate, a deep trench is formed having a lower portion 12 and an upper portion 13. The lower portion 12 serves as the storage node of a capacitor arranged within the deep trench. The storage node comprises a first capacitor electrode 15 arranged within the substrate, a dielectric layer 14 covering the sidewalls of the lower portion 12 of the deep trench and a second electrode 16 arranged within the trench. The inner electrode 16 is comprised of polysilicon. The polysilicon filling 16 as well as the dielectric layer 14 end within the lower portion 12 of the deep trench. The upper portion 13 of the deep trench is now subject to the subsequent process steps.

The semiconductor wafer has a PAD-silicon nitride layer 18 on its top surface. The PAD nitride 18 remains during process steps on the layer an must, therefore, not he damaged by the etching steps. A conformal oxide layer 17 deposited on the wafer surface and conformally covers the top surface 172, the vertical sidewalls 174 of the upper portion 13 of the trench and the horizontal bottom 171 of the trench forming a contact area to the polysilicon fill material of the lower portion 12 of the trench. The thickness of the deposited layer 17 can be different on various areas of the wafer e.g., the layer may be slightly thicker on the edge of the wafer compared to the center of the wafer. The goal is to remove all horizontal portions 172, 171 of the trench covering the vertical sidewalls of the portion 13 of the trench. The collar isolation 174 serves to isolate the subsequently introduced polysilicon filling of the upper portion 13 of the trench from the surrounding bulk silicon 11. Adjacent to the collar oxide, e.g., in the area 111 of the silicon substrate, a horizontal or a vertical access transistor is to be formed. The deep trench capacitor and the access transistor together are considered a storage cell in a dynamic random access memory (DRAM).

In a first etch step according to the invention, the result of which is shown in FIG. 2, the horizontal surface 172 is partially etched and the horizontal surface 171 of the silicon oxide layer 17 is fully removed, whereas the vertical portions 174 are still present. The first etch step uses an etch gas composition with the chemicals $CF_4$, $O_2$, $SiF_4$ (carbon tetra fluoride, oxygen, silicon tetra fluoride). The etching is performed in a high-density plasma reactor. The etching opens the bottom of the trench and fully removes the previously present portion 171 of the silicon oxide layer and etches slightly into the polysilicon filling of the lower portion of the trench leaving a bow-shaped surface. On the top surface, the silicon oxide layer is only partially removed so that the underlying silicon nitride layer 18 is still completely covered by silicon oxide 172. Since the etch rate of polysilicon is about three times higher than the etch rate of silicon oxide, the etch chemistry readily attacks the polysilicon fill 16 within the trench and provides a good end point signal. In contrast, the etch process diminishes the oxide thickness on the top portion 172 on the wafer only slightly due to a combined etch/deposition reaction so that overall a good opened collar is provided on the bottom of the trench. It is to be remarked that at the very top section 173 of the collar oxide in the area where the collar oxide contacts the nitride layer 18, the oxide layer is still present. The removal of the silicon oxide portions 171, 172 may be varying from the center to the edge of the wafer. In any case, there is sufficient thickness of oxide 172 on top of the wafer so that the silicon nitride layer 18 is not attacked during the first step.

After the situation shown in FIG. 2 has been reached by a fixed etch time or appropriate endpointing, the second etch step is started using different etch chemistries. The resulting structure is shown in FIG. 3. The etch gas composition during the second etch step uses $C_4F_8$, CO, and $O_2$ (cyclo butane octa fluoride, carbon monoxide, oxygen). This etch chemistry etches silicon oxide with reasonable selectivity to silicon nitride. The thin silicon oxide layer 172 remaining at the end of the first etch step shown in FIG. 2 will now be fully removed from the silicon nitride layer 18. Due to the good selectivity between silicon oxide and silicon nitride almost no nitride is lost and the good nitride uniformity achieved during the nitride deposition is retained. Due to the relatively high etch rate of silicon oxide, the top section 173 of the vertical collar oxide is attacked at the same time. The process time required for the second etch step, however, is established such that, although the top section 173 being recessed, the removal of vertical collar oxide in the region 173 ends within the silicon nitride layer 18 so that the PAD-oxide 19 underneath the PAD-nitride layer 18 is well enough protected by a sufficiently thick vertical collar oxide so that subsequent process steps, especially wet etch steps, do not attack the silicon oxide 19 and under cut of the silicon nitride 18 is avoided.

As shown in FIG. 4, a prior art etch process which only uses $C_4$ $F_8$ chemistry damages the vertical portion of the collar oxide on the uppermost section of the trench heavily so that the protection of the silicon oxide 19 underneath the PAD-silicon nitride 18 in this area by the collar oxide is not sufficient to avoid any further attack by a subsequent wet etch step. In the cross-section shown in FIG. 4, an undercut of silicon nitride would occur at location 191, which is the portion of the PAD-oxide 19 adjacent to the trench.

When compared to a conventional method shown in FIG. 4, the two-step etch process, the result of which is shown in FIG. 3, has substantially more collar oxide thickness left to protect the portion 191 of the PAD-silicon oxide 19. Although the thickness of silicon oxide on the top surface is varying across the wafer after the first etch step e.g., being thicker in the wafer center compared to the wafer etch, the high etch rate of the employed $C_4F_B$ chemistry for silicon oxide compared to the low etch rate of silicon nitride enables to stop the second etch step with substantially all silicon oxide being removed from the silicon nitride without reducing the thickness of the silicon nitride layer.

The surface of the silicon nitride layer 18 shown in FIG. 2 has a good uniformity in thickness. However, it may happen that polymer residues are still present. In this case, the wafer surface on the top of the wafer, the trench sidewalls and especially the trench bottom must be cleaned with an additional $O_2$-sputter etch which is preferably followed by wet clean. In particular, the surface 161 of the inner electrode 16 and the top surface of the PAD-nitride 18 are cleaned from the polymer residues from the second etch step.

Finally, all horizontal layer portions of the previously deposited silicon oxide layer 17 are removed and only the vertical portions 174 of the silicon oxide layer remain after the above described two-step etch process forming a collar isolation that isolates the subsequently to be formed inner filling of the upper portion 13 of the trench from the surrounding silicon substrate 11 that will further contain active areas with access transistors. The inner portion of the trench will be further filled with doped polysilicon in order to provide a conducting inner electrode of the trench capacitor. The subsequent polysilicon fill (not shown in the figure) will then be contacted to the active area in the semiconductor substrate, e.g., by a buried strap.

The invention is preferably applicable to smaller device structures, e.g., down to and less than 110 nm (nanometers). The process performance and the reliability of the manufactured products is increased. The process can be implemented on various plasma etching tools, e.g., RIE- or high-density plasma etchers.

Attached are various examples for process parameters for etching 300 mm-wafers in a process according to the invention.

Example for the first etch step:

| | |
|---|---|
| Total gas flow: | 150–400 sccm |
| Gases: | $C_4F_8$, Ar (optional CO and/or $O_2$) |
| Molar fraction $C_4F_8$: | 0.01–0.10 |

3. Example:

| | |
|---|---|
| Tool: | 300 mm dual frequency plasma etcher |
| Power top: | 500–1500 W |
| Power bottom: | 0–500 W |
| Pressure: | 100–400 mTorr |
| Total gas flow: | 500–1000 sccm |
| Gases: | $C_4F_8$, Ar (optional CO and/or $O_2$) |
| Molar fraction $C_4F_8$: | 0.01–0.10 |

4. Example:

| | |
|---|---|
| Tool: | 300 mm magnetically enhanced reacitve ion plasma etcher |
| Power: | 1000–2500 W |
| Magnetic field: | 0–20 G |
| Pressure: | 50–150 m Torr |
| Total gas flow: | 200–500 sccm |
| Gases: | $C_4F_8$, Ar (optional CO and/or $O_2$) |
| Molar fraction $C_4F_8$: | 0.01–0.10 |

| List of reference numerals | |
|---|---|
| 10 | semiconductor wafer |
| 11 | substrate |
| 111 | active area |
| 112, 113 | portions of substrate |
| 12 | lower portion of trench |
| 13 | upper portion of trench |
| 14 | dielectric |
| 15, 16 | capacitor electrodes |

-continued

| List of reference numerals | |
|---|---|
| 17 | silicon oxide layer |
| 171 | silicon oxide layer at trench bottom |
| 172 | silicon oxide layer at wafer surface |
| 173 | silicon oxide layer at upper edge |
| 174 | silicon oxide layer at collar |
| 18 | silicon nitride layer, PAD-nitride |
| 19 | silicon oxide layer, PAD-oxide |
| 161 | surface of capacitor electrode |
| 191 | silicon oxide layer adjacent to trench |

What is claimed is:

1. A method of forming an isolation layer on the sidewalls of a trench, comprising:
providing a semiconductor wafer comprising a substrate including a first isolation layer stack arranged on a main surface of the substrate and a trench arranged in the substrate;
depositing a second isolation layer on the wafer so as to cover the first isolation layer stack and sidewall and bottom surfaces of the trench;
etching the wafer with a first etch gas composition comprising the gases $CF_4$ and $SiF_4$ and $O_2$; and
etching the wafer in a second etch step subsequent to the first etch step with a second etch gas composition comprising the gas $C_4F_8$.

2. The method according to claim 1, wherein the second etch gas composition further comprises at least one of the gases CO and $O_2$.

3. The method according to claim 1, wherein the first etch step is stopped when a portion of the second isolation layer that covers the bottom surface of the trench is removed.

4. The method according to claim 3, wherein the first isolation stack remains covered by the second isolation layer after the first etch step is stopped.

5. The method according to claim 1, wherein the first isolation layer stack comprises silicon nitride and the second isolation layer comprises silicon oxide.

6. The method according to claim 1, further comprising sputter etching using $O_2$ to clean the surface of a capacitor electrode arranged within the trench and the surface of the first isolation layer stack from residues of the second etch step.

7. A method of manufacturing a trench capacitor, comprising:
providing a semiconductor wafer comprising a substrate including a first isolation layer stack arranged on a main surface of the substrate and a deep trench arranged in the substrate, wherein the deep trench includes a lower portion filled with silicon, a dielectric layer arranged on sidewalls of the lower portion, and an upper portion arranged above the lower portion;
depositing a second isolation layer on the wafer so as to cover the first isolation layer stack, sidewall surfaces of the upper portion of the deep trench and a bottom surface of the upper portion of the deep trench that is defined at a top surface of the silicon filling the lower portion of the deep trench;
etching the wafer with a first etch gas composition comprising the gases $CF_4$ and $SiF_4$ and $O_2$; and
etching the wafer in a second etch step subsequent to the first etch step with a second etch gas composition comprising the gas $C_4F_8$.

8. The method according to claim 7, wherein the second isolation layer is a collar isolation and the upper portion of the deep trench is further filled with doped silicon.

9. The method according to claim 6, wherein the sputter etching is subsequent to the second etch step.

10. The method according to claim 7, wherein the second etch gas compositions further comprises at least one of the gases CO and $O_2$.

11. The method according to claim 7, wherein the first etch step is stopped when a portion of the second isolation layer, which is arranged on the bottom surface of the upper portion of the deep trench, is removed.

12. The method according to claim 11, wherein the first isolation stack remains covered by the second isolation layer after the first etch step is stopped.

13. The method according to claim 7, wherein the first isolation layer stack comprises silicon nitride and the second isolation layer comprises silicon oxide.

14. The method according to claim 7, further comprising a sputter etching using $O_2$ to clean the surface of a capacitor electrode arranged within the trench and the surface of the first isolation layer stack from residues of the second etch step.

15. The method according to claim 14, wherein the sputter etching is subsequent to the second etch step.

* * * * *